(12) United States Patent
Lee et al.

(10) Patent No.: US 6,537,846 B2
(45) Date of Patent: Mar. 25, 2003

(54) SUBSTRATE BONDING USING A SELENIDATION REACTION

(75) Inventors: Heon Lee, Sunnyvale, CA (US); Chung Ching Yang, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 11 days.

(21) Appl. No.: 09/823,550

(22) Filed: Mar. 30, 2001

(65) Prior Publication Data

US 2003/0017679 A1 Jan. 23, 2003

(51) Int. Cl.$^7$ .............................................. H01L 21/06
(52) U.S. Cl. ...................... 438/102; 438/455; 438/456; 143/33.1; 143/33.6
(58) Field of Search ................................. 438/455, 456, 438/457, 458, 459, 102; 143/33.1, 33.2, 33.3, 33.4, 33.5, 33.6

(56) References Cited

U.S. PATENT DOCUMENTS

| | | | |
|---|---|---|---|
| 5,627,012 A | 5/1997 | Tominaga et al. | 430/270 |
| 5,871,630 A | 2/1999 | Bhattacharya et al. | 205/192 |
| 5,981,360 A * | 11/1999 | Rabarot et al. | 438/455 |
| 6,036,772 A | 3/2000 | Hino et al. | 117/95 |
| 6,048,442 A | 4/2000 | Kushiya et al. | 204/192.28 |
| 6,258,620 B1 * | 7/2001 | Morel et al. | 438/57 |
| 6,323,417 B1 * | 11/2001 | Gillespie et al. | 136/262 |
| 6,426,264 B1 * | 7/2002 | Kawai | 438/311 |
| 6,468,923 B1 * | 10/2002 | Yonehara et al. | 438/761 |

OTHER PUBLICATIONS

Arokiaraj et al. "Characterization of GaAs PN Junction Bonded on Selenium Sulphide (SeS2) Treated Si Substrates" IEEE, 2000, pp. 1281–1284.*

* cited by examiner

Primary Examiner—Matthew Smith
Assistant Examiner—Renzo N. Rocchegiani
(74) Attorney, Agent, or Firm—Trueman H. Denny, III

(57) ABSTRACT

A selenidation reaction for bonding one or more active substrates to a base substrate is disclosed. A bonded-substrate is fabricated by forming a first multi-stacked layer of selenium and indium on a bonding surface of an active substrate and forming a second multi-stacked layer of selenium and indium on a mounting surface of a base substrate. The first and second multi-stacked layers are placed into contact with each other with substantially no pressure. Then the active substrate and the base substrate are bonded to each other by annealing them in an inert ambient to form an indium-selenium compound bond layer that adhesively bonds the substrates to each other. The annealing can occur at a lower temperature than prior wafer-bonding processes and the first and second multi-stacked layers can be deposited over a wide range of relatively low temperatures including room temperature. Additionally, tellurium can be added to the selenium of either one or both of the first and second multi-stacked layers to reduce the annealing temperature and to form an indium-selenium-tellurium compound bond layer that adhesively bonds the substrates to each other. Elemental compounds or amorphous compounds can be used for the materials of the first and second multi-stacked layers to form a polycrystalline or amorphous compound bond layer respectively. One advantage of the compound bond layer is that it can be dissolved using a selective wet etching material so that the active substrate and the base substrate can be non-destructively detached from each other.

25 Claims, 10 Drawing Sheets

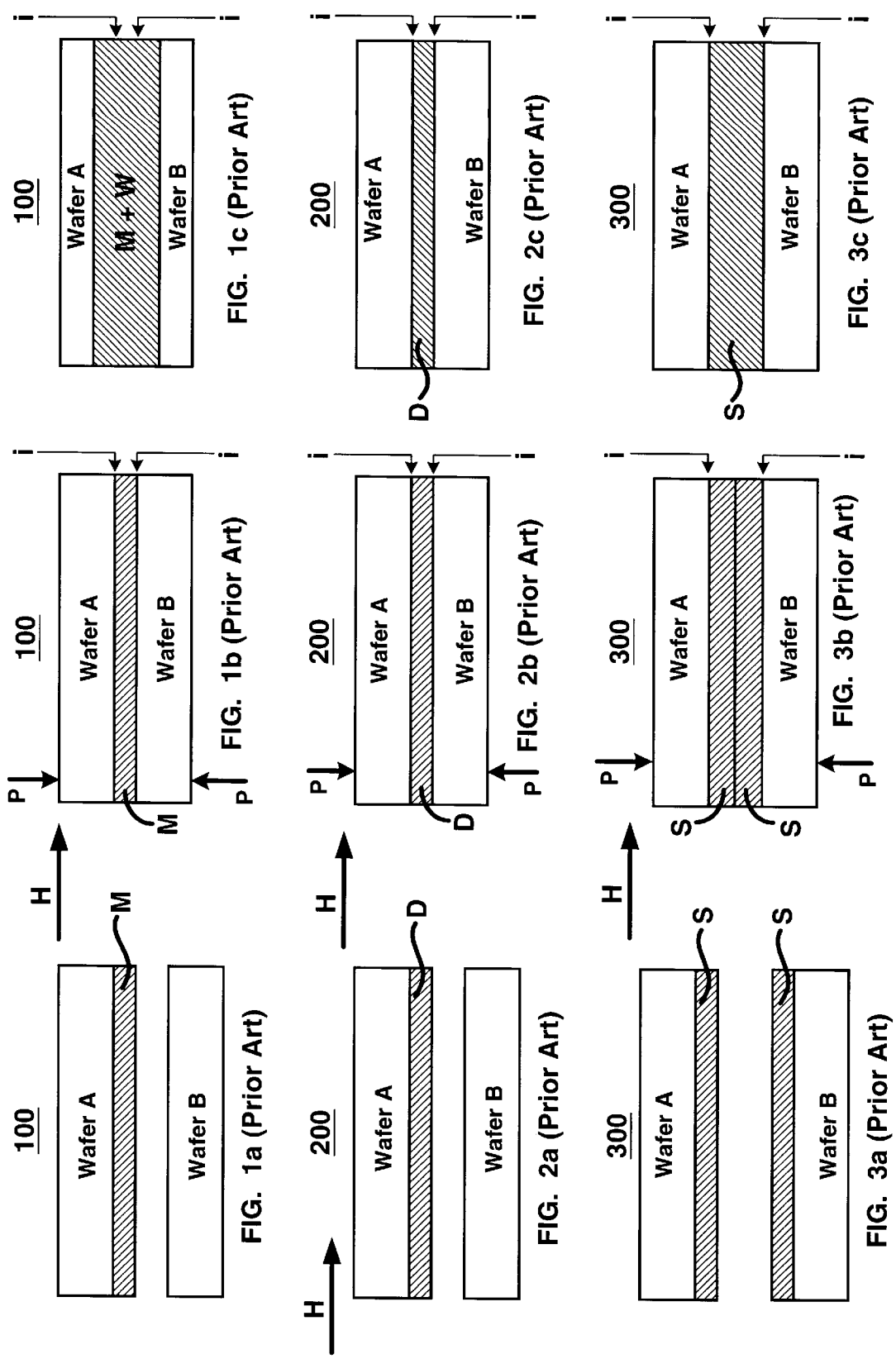

10

10
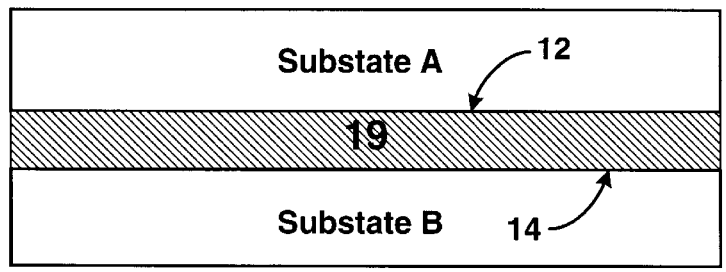
FIG. 10a
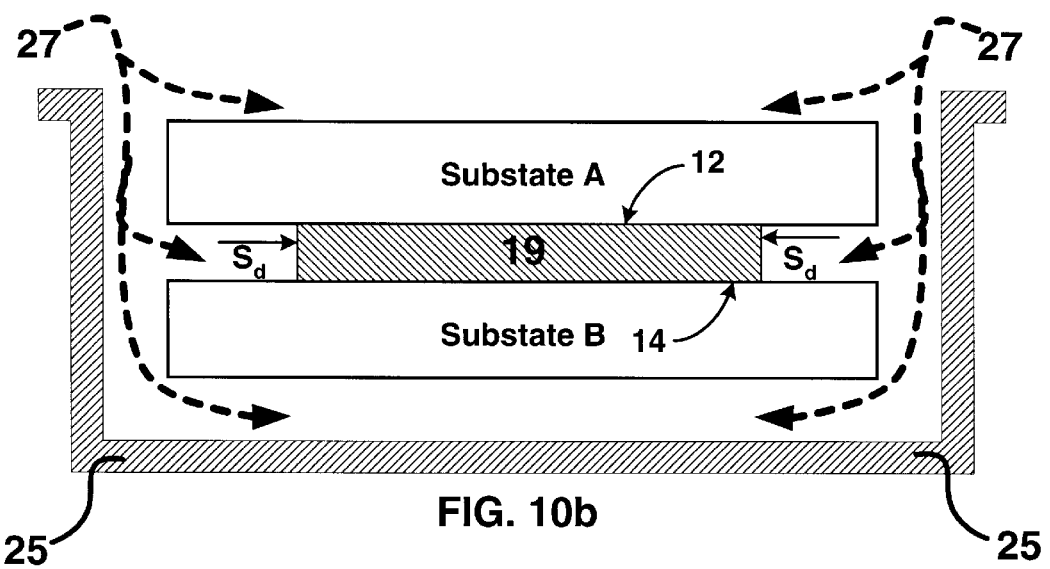
FIG. 10b
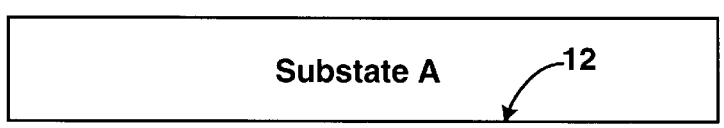
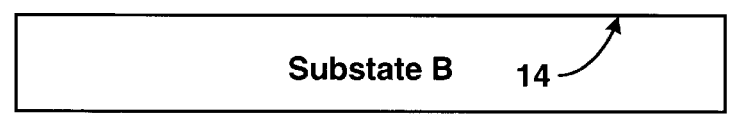
FIG. 10c

SUBSTRATE BONDING USING A SELENIDATION REACTION

FIELD OF THE INVENTION

The present invention relates generally to a compound bond layer formed by a selenidation reaction. The compound bond layer adhesively bonds two or more substrates to each other. More specifically, the present invention relates to a polycrystalline or an amorphous compound bond layer formed by a selenidation reaction and including a first multi-stacked layer of selenium and indium or selenium-tellurium and indium formed on a bonding surface of an active substrate and a second multi-stacked layer of selenium and indium or selenium-tellurium and indium formed on a mounting surface of a base substrate. The resulting compound bond layer adhesively bonds the active substrate and the base substrate to each other without having to apply pressure to achieve the bonding and the compound bond layer can be dissolved so that the active substrate and the base substrate can be non-destructively detached from each other.

BACKGROUND ART

It is well known in the microelectronics art to use wafer bonding to bond one wafer to another wafer in order to efficiently manufacture complementary metal-oxide semiconductor (CMOS) circuitry or to fabricate micromachined structures such as Microelectromechanical Systems (MEMS). Prior wafer bonding process include silicidation, oxidation such as in a silicon-on-insulator (SOI) wafer bond, and metal hot pressing.

FIGS. 1a through 1c illustrate a prior silicidation wafer bonding process 100 In FIG. 1a, a Wafer A that is to be bonded to a Wafer B has a metal M deposited on a surface thereof. Alternatively, the metal M could be deposited on a surface of Wafer B. The metal M can be a metal such as tungsten (W) and wafers (A, B) can be silicon (Si) wafers. Next, in FIG. 1b, the wafers (A, B) are urged in to contact with each other and pressure P and heat H are applied to effectuate a silicidation reaction. The surfaces of the wafers (A, B) that are in contact with the metal M define an interface i. Typically, the heat H is in the range of about 300 degrees centigrade to about 450 degrees centigrade. Finally, in FIG. 1c, the silicidation reaction has proceeded to completion with the metal M reacting with the wafers (A, B) and diffusing beyond the interface i and into the material of the wafers (A, B) to form a metal silicide M+W. For example, if the metal is tungsten (W) and the wafers (A, B) are silicon, then the metal silicide M+W is WSi.

FIGS. 2a through 2c illustrate a prior oxidation wafer bonding process 200. In FIG. 2a, a Wafer A that is to be bonded to a Wafer B has a dielectric material D deposited on a surface thereof. Alternatively, the dielectric material D could be deposited on a surface of Wafer B. Typically, the dielectric material D is silicon oxide ($SiO_2$) and wafers (A, B) are silicon (Si) wafers. Next, in FIG. 2b, the wafers (A, B) are urged in to contact with each other and pressure P and heat H are applied to effectuate a bonding of Wafer A to Wafer B. The surfaces of the wafers (A, B) that are in contact with the dielectric material D define an interface i. For the oxidation wafer bonding process 200, the heat H can be in a range of about 700 degrees centigrade to about 900 degrees centigrade. Finally, in FIG. 2c, the bonding is completed and the dielectric material D has not diffused beyond the interface i.

FIGS. 3a through 3c illustrate a prior metal hot pressing wafer bonding process 300. In FIG. 3a, a Wafer A and a Wafer B that are to be bonded to each other have a soft metal S deposited on a surface thereof. For instance, the soft metal S can be gold (Au) and wafers (A, B) can be silicon (Si) wafers. Next, in FIG. 2b, the wafers (A, B) are urged in to contact with each other and pressure P and heat H are applied to effectuate a bonding of Wafer A to Wafer B. The surfaces of the wafers (A, B) that are in contact with the soft metal S define an interface i. The heat H can be in a range of about 400 degrees centigrade to about 500 degrees centigrade. Finally, in FIG. 2c, the bonding is completed and the soft metal S has not diffused beyond the interface i.

There are several disadvantages to the prior wafer bonding processes. First, for CMOS circuitry or other temperature sensitive components such as MEMS structures, the high temperatures (i.e. the heat H) required by the prior wafer bonding process can damage the CMOS circuitry or the MEMS structures. For instance, prior wafer bonding processes can require temperatures in excess of 500 degrees centigrade. CMOS integrated circuits can be damage when exposed to temperatures of about 500 degrees centigrade or more. Moreover, there may be applications yet to be identified that can not tolerate temperatures that are even close to the high temperatures of the prior wafer bonding processes but would non-the-less benefit from wafer bonding techniques. Additionally, heat is also required in the deposition of some bonding materials such as silicon oxide ($SiO_2$). Some applications that are heat sensitive may require a bonding material that can be deposited at low temperatures.

Second, the high pressure (i.e. the pressure P) that is used to urge the wafers into contact with each other can result in breakage, distortion, stress, or damage to the wafers or to the resulting wafer bond.

Third, once the wafers are bonded to each other it is not possible to non-destructively detach the bonded wafers from each other. Therefore, a non-reversible wafer bond precludes situations where it would be desirable to separate the wafers or to salvage the wafers.

Fourth, the prior wafer bonding processes are not amendable to bonding two or more substrates (i.e. two or more of the wafers A) onto a single substrate (i.e. the wafer B). In some application it may be desirable to bond a several substrates onto a single substrate.

Fifth, the prior wafer bonding processes often require that the wafers or substrates to be bonded be made from identical materials or similar materials. For example, in some prior wafer bonding processes the wafers (A, B) must be made from silicon (Si). Therefore, flexibility in selecting the material for the wafers is limited and applications that require different materials for the wafers are not accommodated by the prior wafer bonding processes.

Finally, some prior wafer bonding processes result in the bonding material chemically reacting with the wafers and diffusing into the wafers. In some applications it may be desirable to eliminate any diffusion or interfacial reaction between the wafer and the bonding material.

Therefore there is a need for a bonding process that can be accomplished at temperatures that are much lower than the prior wafer bonding processes so that damage to circuitry or other structures residing on the bonded wafers is eliminated and applications that can only tolerate much lower temperatures can be wafer bonded. Additionally, there is a need for a bonding material that can be deposited at low temperatures. There also exists a need for a wafer bonding process that does not require the application of pressure in order to bond the wafers to each other. Additionally, there exists a need for a wafer bond material that allows for the bonded wafers to be non-destructively detached from each other. There is also a need for a bonding material that will not react with nor diffuse the wafer. Moreover there is a need for a wafer bonding process that allows for two or more substrates to be mounted and bonded to a single substrate. Lastly, there exists a need for a wafer bonding process in which dissimilar substrates can be bonded to each other.

SUMMARY OF THE INVENTION

The aforementioned needs are met by the substrate bonding process of the present invention. The high temperature problem is solved by using a selenidation reaction that requires temperatures that are significantly lower than the prior wafer bonding processes. The problems associated with depositing the bonding material at high temperatures are also solved by a choice of bonding materials for the present invention. Those materials can be deposited at a range of low temperatures including room temperature. The substrate bonding process of the present invention does not require the substrates to be urged into contact with each other under high pressure thereby solving the aforementioned problems associated with bonding wafers under high pressure. Additionally, the bonding materials of the present invention allow the bonded substrates to be non-destructively detached from one another by exposing the bonded substrates to a selective etchant that dissolves the bonding materials without harming the substrates. Accordingly, the present invention allows previously bonded substrates to be salvaged, reworked, or recycled. The substrate bonding process of the present invention also accommodates bonding one or more substrates to a base substrate thereby overcoming the limitations of the prior wafer bonding processes that allowed for only one substrate to be bonded to another substrate. Another advantage of the substrate bonding process of the present invention is that the bonding materials allow for dissimilar substrates to be bonded to each other. Therefore, the problem of lack of flexibility in the selection of substrate materials is solved by the present invention. Lastly, the bonding materials of the present invention do not chemically react with nor diffuse into the substrates to be bonded.

Broadly, the present invention is embodied in a method for fabricating a bonded substrate using a selenidation reaction to form a compound bond layer that adhesively bonds at least one active substrate to a base substrate. The compound bond layer includes alternating layers of a first material that includes selenium or selenium and tellurium and a second material that includes indium, gallium, antimony, and aluminum. The first and second materials are deposited at a low temperature on a bonding surface of the active substrate and on a mounting surface of the base substrate. After the alternating layers have been deposited, the substrates are then placed into contact with each other without the need to apply substantial pressure to the substrates. The substrates are then annealed to form the compound bond layer.

In one embodiment of the present invention, the annealing step includes heating the active and base substrates at a temperature ranging from about 200 degrees centigrade to about 300 degrees centigrade.

In another embodiment of the present invention, the first layer includes selenium and tellurium and the annealing step includes heating the active and base substrates at a temperature ranging from about 150 degrees centigrade to about 300 degrees centigrade.

In yet another embodiment of the present invention, the alternating layers of the first and second materials are deposited at a temperature ranging from about 0.0 degrees centigrade to about 50.00 degrees centigrade.

In one embodiment of the present invention, the bonded-substrate can be non-destructively detached by exposing the bonded-substrate to a selective etching material that dissolves the compound bond layer so that the active and base substrates are no longer bonded to each other.

In another embodiment of the present invention, the first material and the second material comprise elemental compounds and the annealing step results in those elemental compounds forming a polycrystalline compound bound layer that adhesively bonds the active substrates to the base substrate.

In an alternative embodiment of the present invention, the first material and the second material comprise amorphous compounds and the annealing step results in those amorphous compounds forming an amorphous compound bound layer that adhesively bonds the active substrates to the base substrate.

In yet another embodiment of the present invention, a first amorphous layer is deposited on a bonding surface of an active substrate and a second amorphous layer is deposited on a mounting surface of a base substrate, and the active and base substrates are annealed to form an amorphous compound bound layer that adhesively bonds the active substrates to the base substrate.

In one embodiment of the present invention, a plurality of active substrates are bonded to each other by the compound bond layer to form a three-dimensional stack of active substrates that are bonded to the base substrate by another compound bond layer that can be polycrystalline or amorphous.

In other embodiments of the present invention, the active and base substrates can be made from materials including identical materials, dissimilar materials, a semiconductor material including a semiconductor wafer, a metal material, and a dielectric material.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIGS. 1a through 1c are an illustration of a prior art silicidation wafer bonding process.

FIGS. 2a through 2c are an illustration of a prior art oxidation wafer bonding process.

FIGS. 3a through 3c are an illustration of a prior art hot metal pressing wafer bonding process.

FIGS. 10a through 1c are an illustration of a process for non-destructively detaching one or more active substrates from a base substrate according to the present invention.

DETAILED DESCRIPTION

Figure 4A:
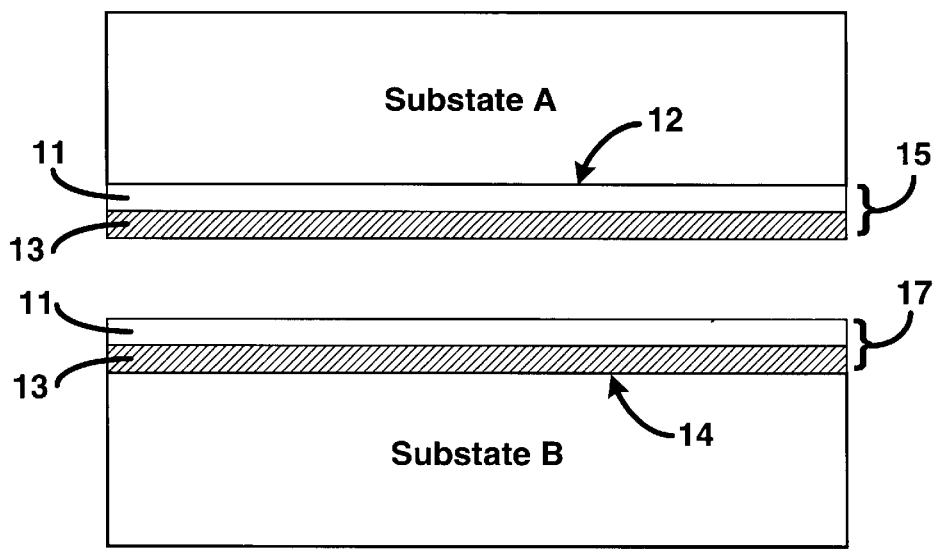
FIGS. 4a and 4b illustrate an active substrate and a base substrate having alternating layers of a first material and a second material according to the present invention.

In the following detailed description and in the several figures of the drawings, like elements are identified with like reference numerals.

As shown in the drawings for purpose of illustration, the present invention is embodied in a bonded-substrate, a method for fabricating a bonded-substrate, and a method for non-destructively detaching a bonded-substrate. The bonded-substrate includes at least one active substrate having a bonding surface, a base substrate having a mounting surface, and a compound bond layer connected with the bonding and mounting surfaces that adhesively bonds the active substrate to the base substrate. The active substrate and the base substrate can be non-destructively detached from each other by dissolving the compound bond layer as will be described below. The compound bond layer can have an amorphous or a polycrystalline morphology.

The method for fabricating the bonded-substrate includes forming a first multi-stacked layer by depositing alternating layers of a first material and a second material on a bonding surface of the active substrate and forming a second multi-stacked layer by depositing alternating layers of the first material and the second material on a mounting surface of the base substrate. The first and second multilayer stack layers are then placed into contact with each other. The active substrate and the base substrate are bonded to each other by annealing the substrates to form a compound bond layer that adhesively bonds the active substrate to the base substrate. The first and second materials can be an elemental compound so that the resulting compound bond layer is a polycrystalline compound bond layer. Alternatively, the first and second materials can be an amorphous compound so that the resulting compound bond layer is an amorphous compound bond layer (i.e. an amorphous compound bond layer is a layer that has no long range order).

The method for non-destructively detaching a bonded-substrate includes sacrificially etching the compound bond layer with a selective etch material that dissolves the compound bond layer without attacking or damaging the active or base substrates. The etching is continued until the active substrate and the base substrate are no longer connected to each other.

In FIG. 4a, a method for fabricating a bonded-substrate that includes at least one active substrate A and a base substrate B includes forming a first multi-stacked layer 15 on a bonding surface 12 of the active substrate A, and forming a second multi-staked layer 17 on a mounting surface 14 of the base substrate B. The first multi-stacked layer 15 is formed by depositing alternating layers of a first material 11 and a second material 13 on the bonding surface 12. Similarly, the second multi-stacked layer 17 is formed by depositing alternating layers of the first material 11 and the second material 13 on the mounting surface 14.

Preferably, the bonding surface 12 and the mounting surface 14 are substantially flat surfaces with a smooth mirror-like finish. The active substrate A and the base substrate B can be pre-manufactured so that the bonding and mounting surfaces (12, 14) are substantially flat and have a smooth mirror-like finish. Alternatively, the bonding and mounting surfaces (12, 14) can be planarized by a process such as grinding or polishing. For instance, chemical mechanical polishing (CMP) can be used to planarize the bonding and mounting surfaces (12, 14).

The first material 11 of the first or second multi-staked layers (15, 17) can be a material that includes but is not limited to those set forth in Table 1 below.

TABLE 1

| Materials for the first material 11 |
| --- |
| Selenium (Se) |
| Selenium-Tellurium (SeTe) |

The second material 13 of the first or second multi-staked layers (15, 17) can be a material that includes but is not limited to those set forth in Table 2 below.

TABLE 2

| Materials for the second material 13 |
| --- |
| Indium (In) |
| Gallium (Ga) |
| Antimony (Sb) |
| Aluminum (Al) |

The first and second multi-stacked layers (15, 17) can be deposited by sputtering or by physical vapor deposition (PVD, i.e. e-beam evaporation). If the first and second materials (11, 13) are an elemental compound (i.e. to form a polycrystalline compound bond layer), then PVD is the preferred deposition technique. On the other hand, if the first and second materials (11, 13) are an amorphous compound (i.e. to form an amorphous compound bond layer), then sputtering is the preferred deposition technique. One advantage to using sputtering or PVD, is that the a lower range of temperatures can be used to effectuate the depositions.

Although FIG. 4a illustrates the first material 11 in contact with the bonding surface 12 and the second material 13 in contact with the mounting surface 14, the order in which the alternating layers of the first material 11 and the second material 13 are deposited can be reversed. That is, the bonding surface 12 and the mounting surface 14 can have a layer of the first material 11 or a layer of the second material 13 deposited thereon. Accordingly, there is great flexibility in the order in which the alternating layers of the first material 11 and the second material 13 are deposited and in the number of alternating layers. For instance, in FIG. 4a, two layers of the first material 11 and the second material 13 are deposited on the bonding and mounting surfaces (12, 14) respectively. On the other hand, in FIG. 4b, the first multi-staked layer 15 on the bonding surface 12 consists of three layers and the second multi-staked layer 17 on the mounting surface 14 consists of four layers.

Figure 4B:
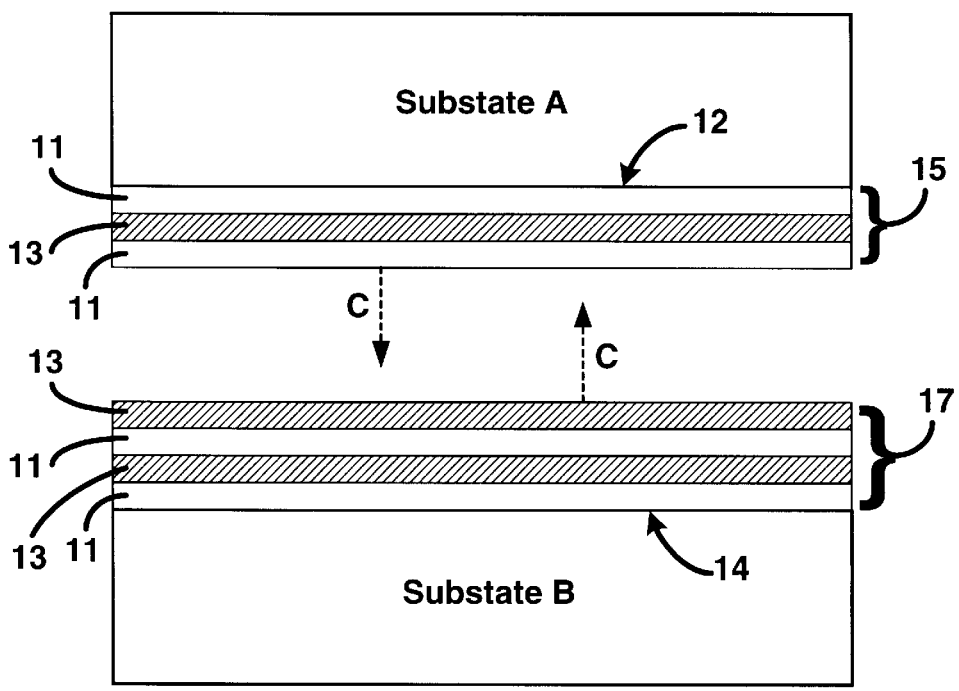

That flexibility is further illustrated in FIG. 4b, where the first multi-stacked layer 15 includes an alternating layer (11, 13, 11) and the second multi-stacked layer 17 includes an alternating layer (11, 13, 11, 13). In FIG. 4b, both the bonding surface 12 and the mounting surface 14 have a layer of the first material 11 deposited thereon. In contrast, in FIG. 4a, the bonding surface 12 has a layer of the first material 11 deposited thereon and the mounting surface 14 has a layer of the second material 13 deposited thereon.

The first and second multi-stacked layers (15, 17) can be deposited over a wide range of low temperatures including a range of temperatures from about 0.0 degrees centigrade to about 50.0 degrees centigrade. For example, the first and second multi-stacked layers (15, 17) can be deposited at room temperature (approximately 25.0 degrees centigrade). One advantage to the low deposition temperatures is that components that are sensitive to high temperatures or that can be damaged by high temperatures are amendable to the substrate bonding method of the present invention. In contrast, those components would not be amendable to the higher temperatures of prior wafer bonding methods as was described above. Although temperatures higher than those set forth above can be used to deposit the first and second multi-stacked layers (15, 17), it is not necessary to do so.

The first material 11 and the second material 13 can have a thickness that varies among the first and second multi-staked layers. That is, the first material 11 and the second material 13 can have identical thicknesses or they can have dissimilar thicknesses. Preferably, the first material 11 and the second material 13 have a thickness within a range of about 50 angstroms to about 2000 angstroms (i.e. from about 0.005 $\mu$m to about 0.20 $\mu$m).

Figure 5:
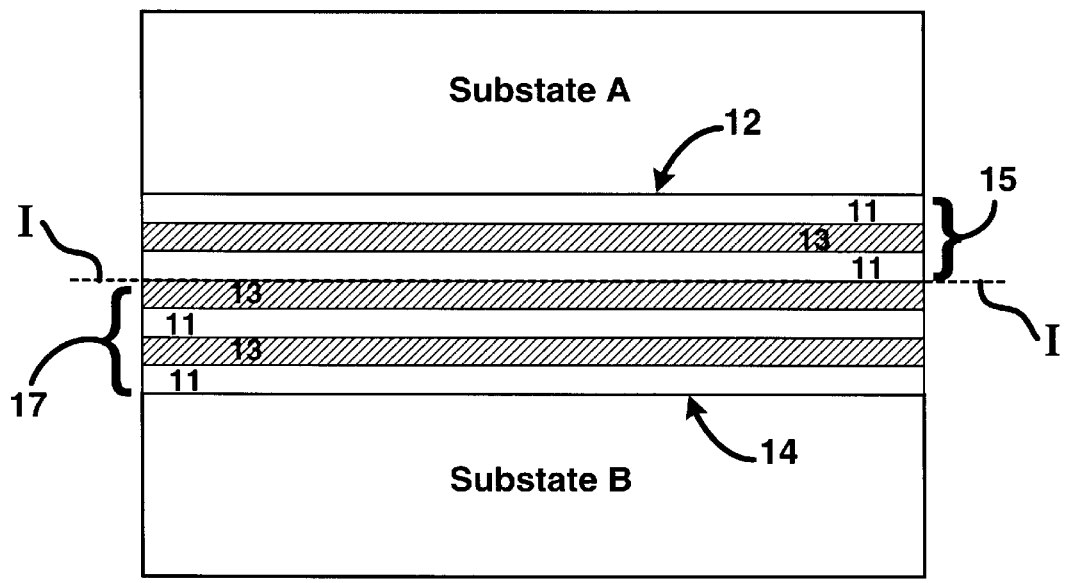
FIG. 5 is an illustration of the active and base substrates of FIGS. 4a and 4b placed into to contact with each other according to the present invention.

In FIG. 4b, after the first and second multi-stacked layers (15, 17) have been deposited, the first and second multi-stacked layers (15, 17) are brought into contact with each other as indicated by dashed arrows C. Accordingly, in FIG. 5, an outermost layer of the first material 11 in the first multi-staked layer 15 is placed in contact with an outermost layer of the second material 13 of the second multi-stacked layer 17 defining an interface I (as illustrated by the dashed line) between the active and base substrates (A, B).

Another advantage of the method for fabricating the bonded-substrate of the present invention is that the first and second multi-stacked layers (15, 17) can be brought into contact with each other with substantially no pressure being applied to the active substrate A and the base substrate B. Consequently, problems associated with distorting, fracturing, breakage, or stressing the substrates is eliminated because the substrates are not forcefully engaged with each other and are not held in contact with each other under high pressure. Equipment commonly used in microelectronic fabrication for handling and positioning of semiconductor materials such as semiconductor wafers can be used to place the first and second multi-stacked layers (15, 17) into contact with each other and to align one or more of the active substrates A with the base substrate B. Due to the combined mass of one or more of the active substrates A and the mass of their respective first multi-stacked layers 15, there will be a some pressure exerted by the active substrates A on the base substrate B. However, that pressure is slight in comparison to the high pressures required by the prior wafer bonding processes.

Figure 6:
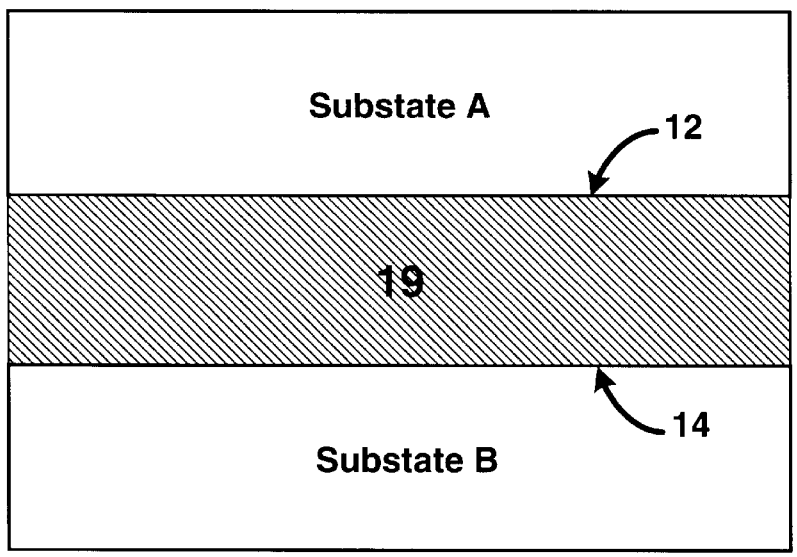
FIG. 6 is an illustration of a bonded-substrate with a compound bond layer that adhesively bonds the active substrate to the base substrate according to the present invention.

In FIG. 6, the active substrate A and the base substrate B are bonded to each other by annealing the substrates (A, B) in an inert ambient to form a compound bond layer 19 from a selenidation reaction between the alternating layers of the first and second materials (11, 13). As a result of the selenidation reaction, the compound bond layer 19 adhesively bonds the active substrate A and the base substrate B to each other to form a bonded substrate 10.

If the first material 11 is selenium (Se) and the second material 13 is indium (In), then the compound bond layer 19 is an indium-selenium ($In_XSe_Y$) compound bond layer that includes but is not limited to compounds such as InSe, and $In_5Se_6$.

Annealing of the substrates (A, B) can be accomplished by heating the substrates (A, B) at a temperature from about 200 degrees centigrade to about 300 degrees centigrade. The inert ambient can be an ambient of nitrogen gas (Ni), for example.

The use of elemental compounds for the first and second materials (11, 13) results in a polycrystalline compound bond layer 19. For instance, if elemental selenium (Se) is used for the first material 11 and elemental indium (In) is used for the second material 13, then the annealing step results in an indium-selenium ($In_XSe_Y$) polycrystalline compound bond layer (see reference numeral 19 of FIG. 6).

In contrast, the use of amorphous compounds for the first and second materials (11, 13) results in an amorphous compound bond layer 19. For instance, if amorphous selenium (Se) is used for the first material 11 and amorphous indium (In) is used for the second material 13, then the annealing step results in an indium-selenium ($In_XSe_Y$) amorphous compound bond layer (see reference numeral 19 of FIG. 6).

In one embodiment of the present invention, tellurium (Te), is added to the selenium (Se) of the first material 11 to form a selenium-tellurium (SeTe) layer. The tellurium (Te) can be added to the selenium (Se) of the first material 11 of either one or both of the first and second multi-stacked layers (15, 17). Accordingly, the first and second multi-stacked layers (15, 17) are formed by depositing alternating layers of selenium-tellurium (SeTe) and the second material 13 on the bonding and mounting surfaces (12,14). The second material 13 can be indium (In), for example. The first and second multi-stacked layers (15, 17) can be deposited within a range of temperatures including a range of temperatures from about 0.0 degrees centigrade to about 50.0 degrees centigrade. For example, the first and second multi-stacked layers (15, 17) can be deposited at room temperature (approximately 25.0 degrees centigrade).

The selenium-tellurium (SeTe) layer and second material 13 can have a thickness that varies among the first and second multi-staked layers. That is, the selenium-tellurium layer of the first material 11 and the second material 13 can have identical thicknesses or they can have dissimilar thicknesses. Preferably, the first material 11 and the second material 13 have a thickness within a range of about 50 angstroms to about 2000 angstroms (i.e. from about 0.005 $\mu$m to about 0.20 $\mu$m).

Subsequently, the substrates (A, B) are annealed in an inert ambient as described above in reference to FIG. 6. If the second material 13 comprises indium (In), then the annealing forms an indium-selenium-tellurium ($In_XSe_YTe_Z$, $In_2Se_{3-X}Te_X$, X<1) compound bond layer 19 from a selenidation reaction between the alternating layers of selenium-tellurium (SeTe) and indium (In). As a result of the selenidation reaction, the indium-selenium-tellurium compound bond layer 19 adhesively bonds the active substrate A and the base substrate B to each other to form the bonded substrate 10. Materials including those set forth above in Table 2 may be substituted for the indium (In) of the second material 13.

In the above embodiment that includes the indium-selenium-tellurium ($In_XSe_YTe_Z$, $In_2Se_{3-X}Te_X$, X<1) compound bond layer 19, the annealing of the substrates (A, B) can be accomplished by heating the substrates (A, B) at a temperature from about 150 degrees centigrade to about 300 degrees centigrade. The inert ambient can be an ambient of nitrogen gas (Ni), for example.

One advantage of the addition of the tellurium (Te) to the selenium (Se) of the first material 11, is that a lower end of the annealing temperature can be reduced by about 50.0 degrees centigrade thereby reducing a thermal budget for annealing the substrates. That is, from the previous lower end of about 200 degrees centigrade (without Te added to the Se) to a new lower end of 150 degrees centigrade (with Te added to the Se). Consequently, the addition of tellurium (Te) allows for substrate bonding at an even lower temperature and that lower temperature may be advantageous in some temperature sensitive applications where substrate bonding at a temperature of about 150 degrees is necessary to prevent damage to the substrates to be bonded or to components carried by the substrates to be bonded. A broad variety of components can be carried by, be mounted on, or be buried in the substrates to be bonded including but not limited to sensors, accelerometers, actuators, pressure sensors, micro mechanical machines, micro electromechanical machines, electron emission devices, optical and electro-optical components, and phase change media for storing data, just to name a few.

The use of elemental compounds for the first and second materials (11, 13) results in a polycrystalline compound bond layer 19. For instance, if elemental selenium-tellurium (SeTe) are used for the first material 11 and elemental indium (In) is used for the second material 13, then the annealing step results in an indium-selenium-tellurium ($In_XSe_YTe_Z$, $In_2Se_{3-X}Te_X$, X<1) compound bond layer 19.

In contrast, the use of amorphous compounds for the first and second materials (11, 13) results in an amorphous compound bond layer 19. For instance, if amorphous selenium-tellurium (SeTe) are used for the first material 11 and amorphous indium (In) is used for the second material 13, then the annealing step results in an indium-selenium-tellurium ($In_XSe_YTe_Z$, $In_2Se_{3-X}Te_X$, X<1m) compound bond layer 19.

The indium-selenium-tellurium ($In_XSe_YTe_Z$ or $In_2Se_{3-X}Te_X$, X<1) compound bond layer 19 and the ($In_XSe_Y$) compound bond layer 19 have an added advantage of being able to adhesively bond a wide variety of substrate materials to each other. The active substrate A and the base substrate B can be made from identical materials or they can be made from dissimilar materials. This is also true in embodiments where there are multiple active substrates mounted on the base substrate B and/or in embodiments where there is a three-dimensional stack of active substrates that are bonded to each other and to the base substrate B as illustrated in FIGS. 9a and 9b.

The active substrate A and the base substrate B can be made from a material including but not limited to silicon (Si) including a silicon wafer, silicon oxide ($SiO_2$), alumina ($Al_2O_3$), and gallium arsenide (GaAs) including a gallium arsenide wafer. Other materials for the active substrate A and the base substrate B include but are not limited to a metal, a semiconductor material including a semiconductor wafer, and a dielectric material. The shape of the active substrate A and the base substrate B will be determined by the application and on the type of components that are carried by the active substrate A and the base substrate B. However, semiconductor wafers such as a single crystal silicon (Si) wafer are a good choice for the active substrate A and the base substrate B because there is an established base of microelectronic fabrication equipment and processes that are well tuned to handling and processing semiconductor wafers.

Figure 7A:
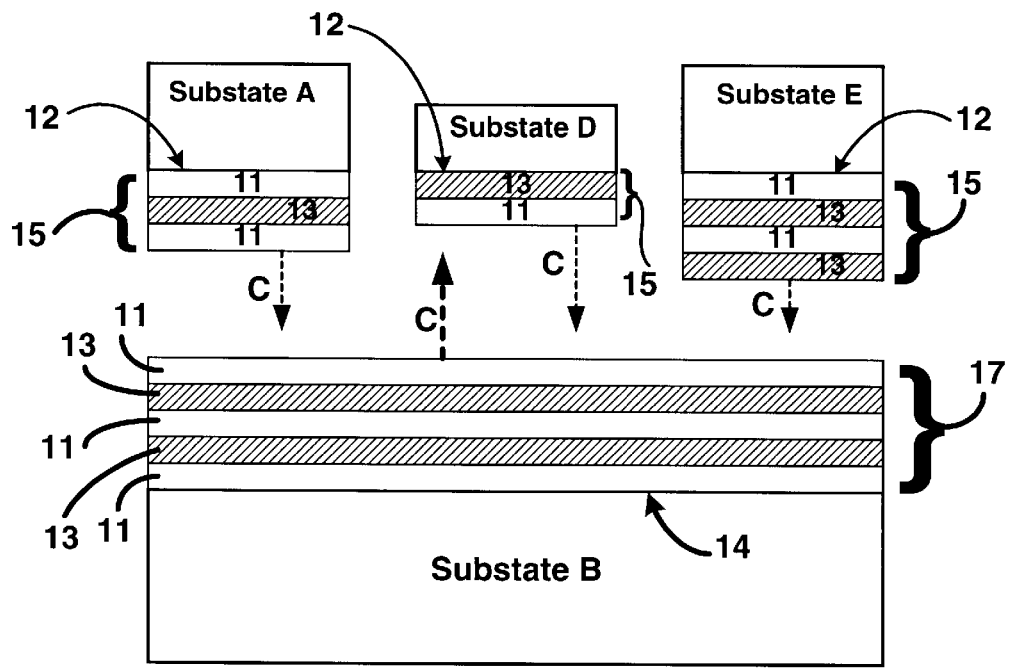
FIG. 7a illustrates a plurality of active substrates and a base substrate having alternating layers of a first material and a second material according to the present invention.
Figure 7B:
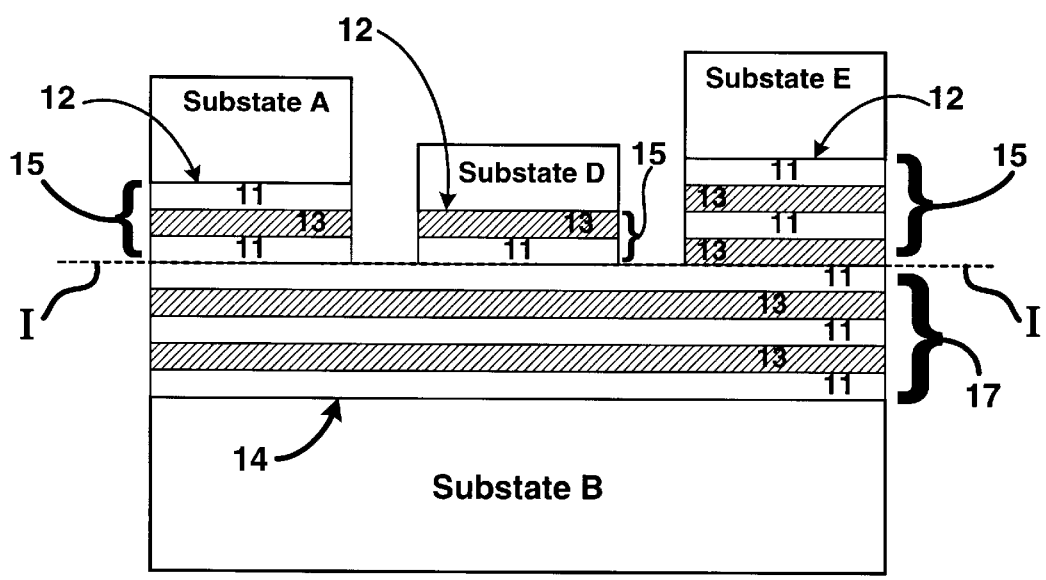
FIG. 7b is an illustration of the active substrates and the base substrate of FIG. 7a placed into to contact with one another according to the present invention.
Figure 9A:
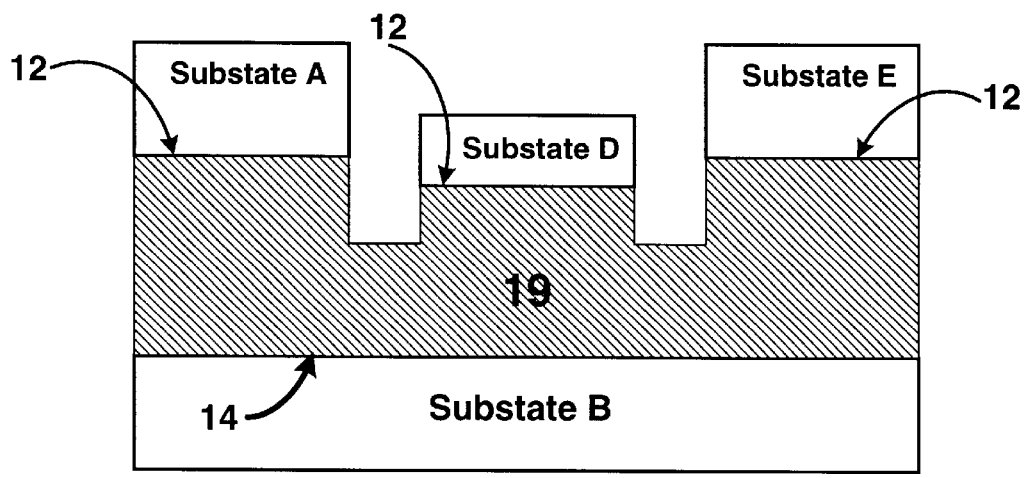
FIG. 9a is an illustration of a bonded-substrate with a compound bond layer that adhesively bonds the active substrates of FIG. 7b to the base substrate according to the present invention.
Figure 9B:
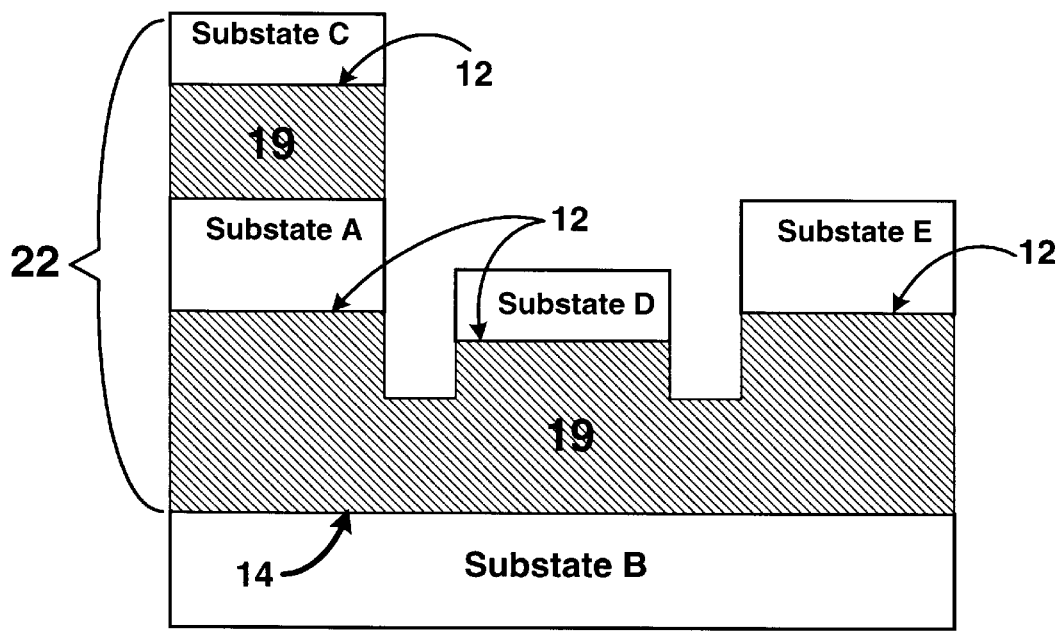
FIG. 9b is an illustration of a bonded-substrate with a compound bond layer that adhesively bonds the active substrates and the three-dimensional stack of FIG. 8b to the base substrate according to the present invention.

FIGS. 7a, 7b, and 9a illustrate another advantage of the present invention, in that the method for fabricating a bonded-substrate accommodates bonding a plurality (three are shown) of active substrates A, D, and E to a base substrate B as illustrated in FIG. 7a. The dimensions of the active substrates A, D, and E can vary or they can be identical. Moreover, as illustrated in FIG. 7a, the first multi-stacked layer 15 of active substrates A, D, and E can vary in the order in which the layers of the first and second materials (11, 13) are deposited on their respective bonding surfaces 12. The number of alternating layers can also vary. For instance, active substrate A has three layers, active substrate D has two layers, and active substrate E has four layers. The first and second multi-stacked layers (15, 17) can be deposited within the same range of temperatures as set forth above.

The second multi-stacked layer 17 on the base substrate B is brought into contact with the first multi-stacked layers 15 of the active substrates A, D, and E as shown by dashed arrows C resulting in the configuration illustrated in FIG. 7b. As was stated above, substantially no pressure needs to be applied to the active substrates A, D, and E and the base substrate B. Accordingly, in FIG. 7b, an outermost layer of the first material 11 of the active substrates A and D are placed in contact with an outermost layer of the first material 11 of the base substrate B and an outermost layer of the second material 13 of the active substrate E is placed in contact with the outermost layer of the first material 11 of the base substrate B defining an interface I (see dashed line) between the active and base substrates.

In FIG. 9a, the active substrates A, D, and E and the base substrate B are bonded to one another other by annealing the substrates (A, B, D, and E) in an inert ambient to form a compound bond layer 19 from a selenidation reaction (as described above) between the alternating layers of the first material 11 and the second material 13. As a result of the selenidation reaction, the compound bond layer 19 adhesively bonds the active substrates A, D, and E and the base substrate B to each other to form a bonded substrate 20. The compound bond layer 19 can be a polycrystalline compound bond layer 19 or an amorphous compound bond layer 19 as was described above.

Figure 8A:
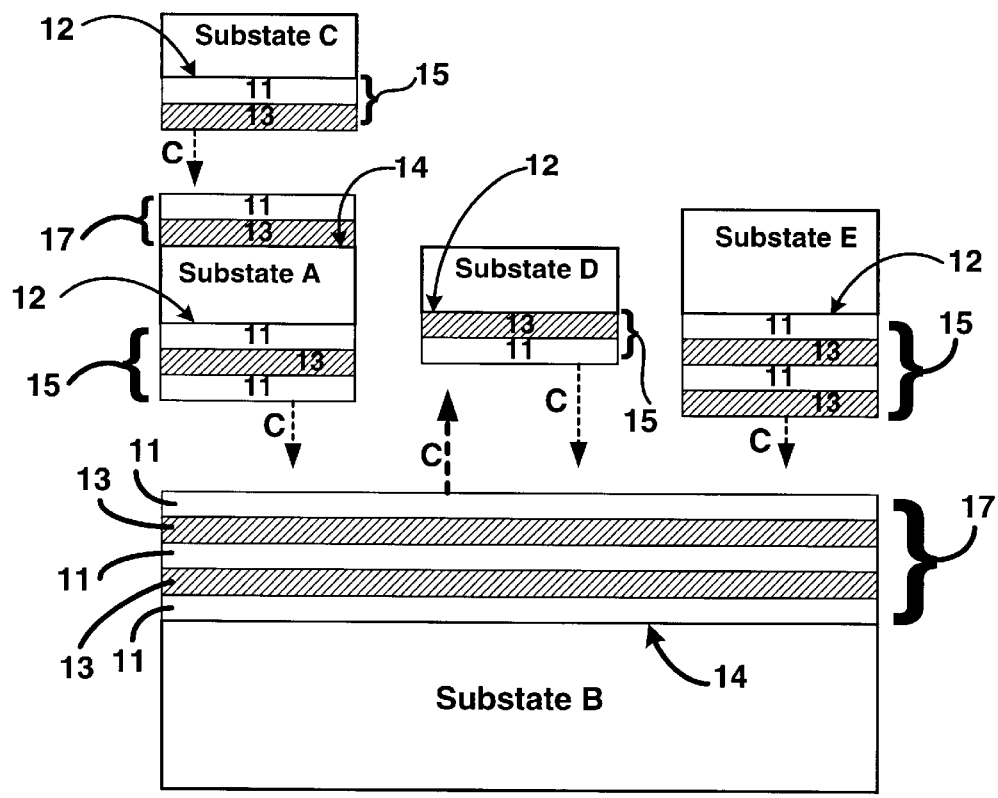
FIG. 8a illustrates a plurality of active substrates including a three-dimensional stack and a base substrate having alternating layers of a first material and a second material according to the present invention.
Figure 8B:
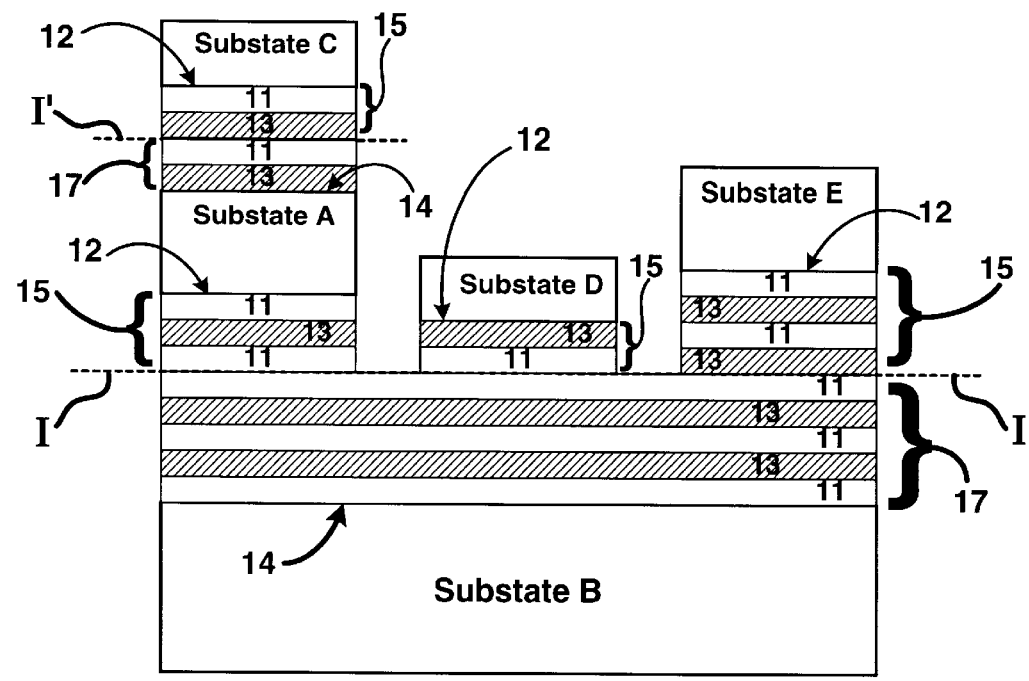
FIG. 8b is an illustration of the active substrates, the three-dimensional stack, and the base substrate of FIG. 8a placed into to contact with one another according to the present invention.

FIGS. 8a, 8b, and 9b illustrate yet another advantage of the present invention, in that the method for fabricating a bonded-substrate accommodates bonding a plurality (three are shown) of active substrates A, D, and E to a base substrate B and bonding a plurality (two are shown) of active substrates A and C to each other as illustrated in FIG. 8a. When active substrates A and C are bonded to each other they form a three-dimensional stack 22 (see FIG. 9b). The dimensions of the active substrates A, C, D, and E can vary or they can be identical. Moreover, the order in which the layers of the first and second materials (11, 13) are deposited on their respective bonding surfaces 12 can vary and the number of alternating layers can also vary as was discussed above in reference to FIGS. 7a, 7b, and 9a.

The second multi-stacked layer 17 on the base substrate B is brought into contact with the first multi-stacked layers 15 of the active substrates A, D, and E, and the first multi-stacked layer 15 of the active substrate C is brought into contact with the second multi-stacked layer 17 of the active substrate A as shown by dashed arrows C resulting in the configuration illustrated in FIG. 8b. As was stated above, substantially no pressure needs to be applied to the active substrates A, C, D, and E and the base substrate B. Accordingly, in FIG. B b, an outermost layer of the first material 11 of the active substrates A and D are placed in contact with an outermost layer of the first material 11 of the base substrate B and an outermost layer of the second material 13 of the active substrate E is placed in contact with the outermost layer of the first material 11 of the base substrate B defining an interface I (see dashed line) between the active and base substrates. Similarly, an outermost layer of the second material 13 of the active substrates C is placed in contact with the outermost layer of the first material 11 of the active substrate A defining an interface I' (see dashed line) between the active substrates (A, C).

In FIG. 9b, the active substrates A, C, D, and E and the base substrate B are bonded to one another other by annealing the substrates (A, B, D, and E) in an inert ambient to form a compound bond layer 19 from a selenidation reaction (as described above) between the alternating layers of the first material 11 and the second material 13. As a result of the selenidation reaction, the compound bond layer 19 adhesively bonds active substrates (A, C) to each other and the active substrates A, D, and E and the base substrate B to one another to form a bonded substrate 30 with multiple active substrates and the three-dimensional stack 22. Essentially, the method for bonding an active substrate to a base substrate using a selenidation reaction according to the present invention also applies to bonding a plurality of active substrates to each other to form a three-dimensional stack 22. Therefore, in FIGS. 8a, 8b, and 9b, active substrate A serves as the base substrate for the active substrate C. Although only two active substrates (A, C) are shown in the three-dimensional stack 22, the three-dimensional stack 22 of the present invention is not limited to the configuration shown and can accommodate a plurality of active substrates. As was mentioned above, in the embodiments illustrated in FIGS. 9a and 9b, the compound bond layer 19 can be a polycrystalline compound bond layer 19 or an amorphous compound bond layer 19.

The compound bond layer 19 (amorphous or polycrystalline) of the present invention provides an added advantage of being able to be dissolved so that the active and base substrates can be non-destructively detached from one another as will be discussed below in reference to FIGS. 10a through 10c, FIGS. 11a through 11c, and FIGS. 12a through 12c.

FIGS. 10a through 10c, illustrate a method for non-destructively detaching a bonded-substrate 10 that includes at least one active substrate A and a base substrate B. The active and base substrates (A, B) are adhesively bonded to each other by a compound bond layer 19. The materials for the compound bond layer 19 can-include the indium-selenium-tellurium ($In_XSe_YTe_Z$ or $In_2Se_{3-X}Te_X$, X<1) compound bond layer 19 and/or the ($In_XSe_Y$) compound bond layer 19 as described above.

The process of detaching the active and base substrates (A, B) from each other includes selectively etching the compound bond layer 19 by exposing the compound bond layer 19 to a selective wet etch material 27 that selectively dissolves the compound bond layer 19 without attacking or damaging the active and base substrates (A, B). For example, the wet etch material 27 can be an acid. Suitable selective wet etch materials include but are not limited to those set forth in Table 3 below.

TABLE 3

Selective Wet Etch Materials 27
for dissolving the compound bond layer 19

| $H_2SO_4$ |
| HCl |
| $HNO_3$ |
| $H_2PO_4$ |

In
FIG. 10b, the bonded-substrate 10 is placed in a vessel 25 and a selective wet etch material 27 is introduced into the vessel 25. The selective wet etch material 27 selectively dissolves the compound bond layer 19 as shown by arrows $S_d$, until the selective wet etch material 27 has dissolved substantially all of the compound bond layer 19 such that the active and base substrates (A, B) are no longer bonded to each other as illustrated in FIG. 10c.

Figure 11A:
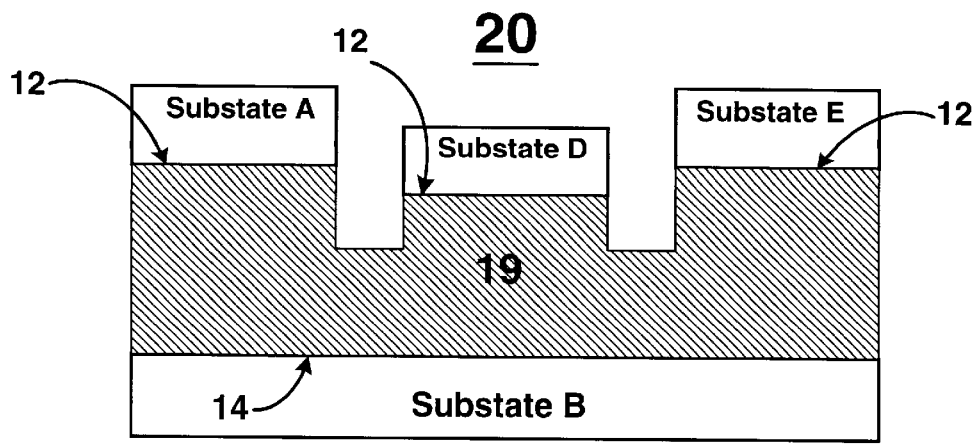
FIGS. 11a through 11c are an illustration of a process for non-destructively detaching a plurality of active substrates from a base substrate according to the present invention.
Figure 11B:
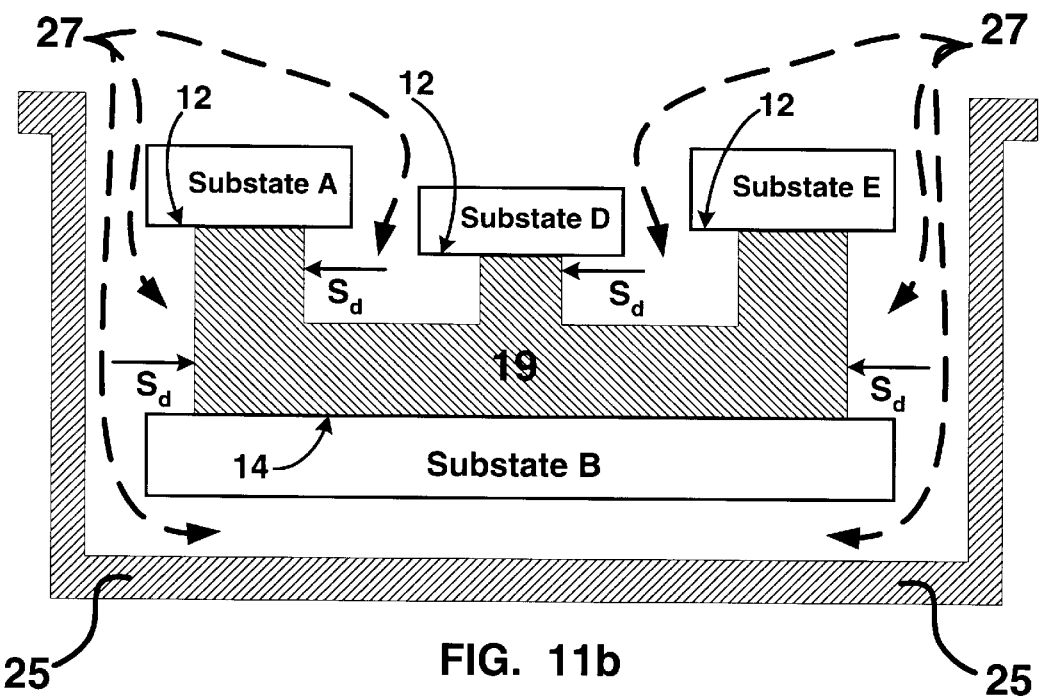
Figure 11C:
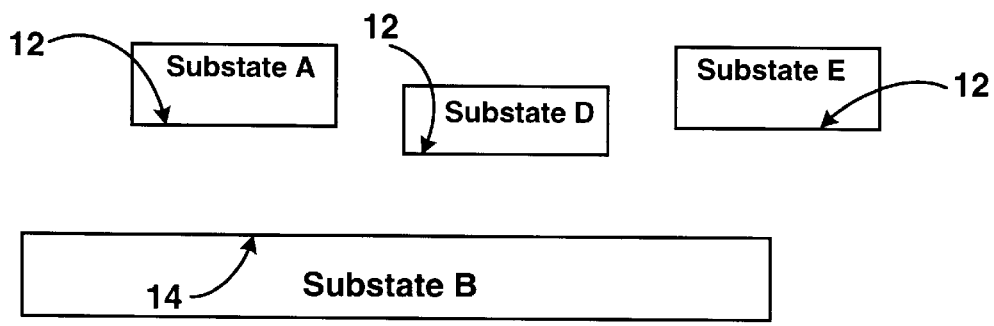

Similarly, in FIGS. 11a through 11c, a bonded-substrate 20 includes a plurality of active substrates (A, D, and E) that are adhesively bonded to a base substrate B by the compound bond layer 19. In FIG. 11b, the bonded-substrate 20 is placed in a vessel 25 and the selective wet etch material 27 is introduced into the vessel 25. The selective wet etch material 27 selectively dissolves the compound bond layer 19 as shown by arrows $S_d$, until the selective wet etch material 27 has dissolved substantially all of the compound bond layer 19 such that the active and base substrates (A, D, E, and B) are no longer bonded to each other as illustrated in FIG. 11c.

Figure 12A:
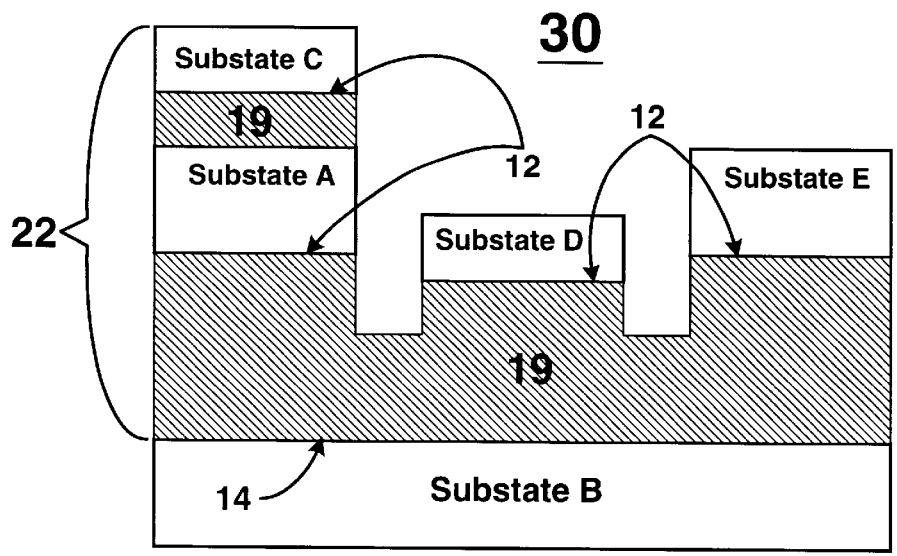
FIGS. 12a through 12c are an illustration of a process for non-destructively detaching a plurality of active substrates and a three-dimensional stack from a base substrate according to the present invention.
Figure 12B:
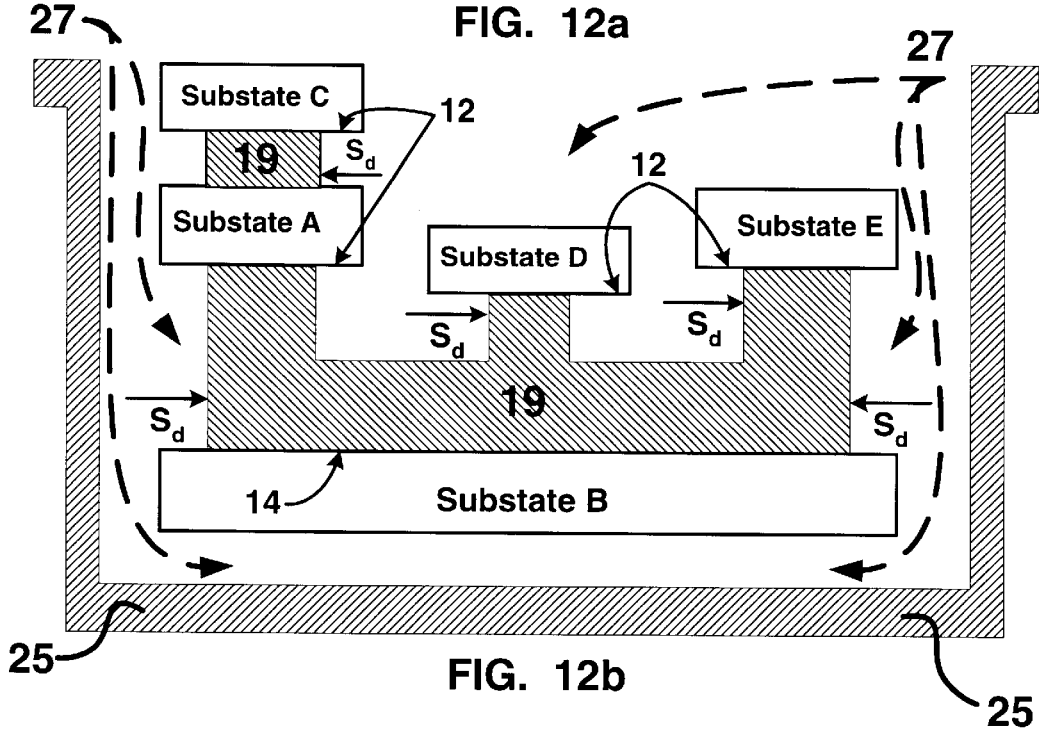
Figure 12C:
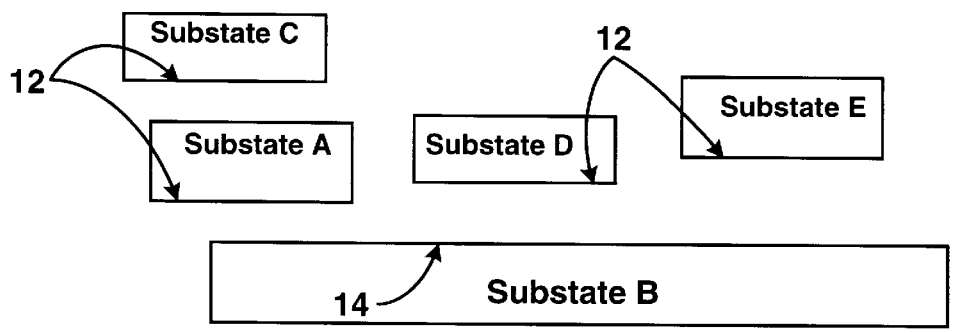

Finally, in FIGS. 12a through 12c, a bonded-substrate 30 includes a plurality of active substrates (A, D, and E) that are adhesively bonded to a base substrate B by the compound bond layer 19 and a plurality of active substrates (A, C) that are adhesively bonded to each other by the by the compound bond layer 19 to form the three-dimensional stack 22. In FIG. 12b, the bonded-substrate 30 is placed in a vessel 25 and the selective wet etch material 27 is introduced into the vessel 25. The selective wet etch material 27 selectively dissolves the compound bond layer 19 as shown by arrows $S_d$, until the selective wet etch material 27 has dissolved substantially all of the compound bond layer 19 such that the active and base substrates (A, C, D, E, and B) are no longer bonded to one another other as illustrated in FIG. 12c.

Figure 13A:
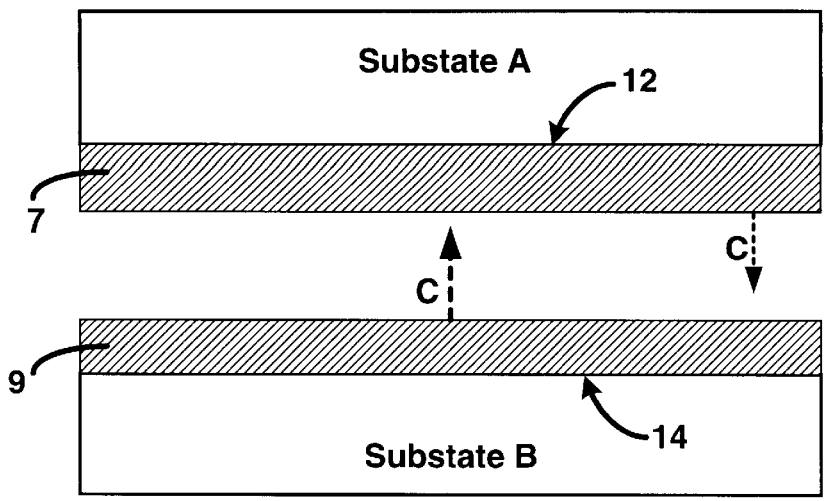
FIGS. 13a through 13c are an illustration of active and base substrates having a first and second amorphous layer formed respectively thereon according to the present invention.
Figure 13B:
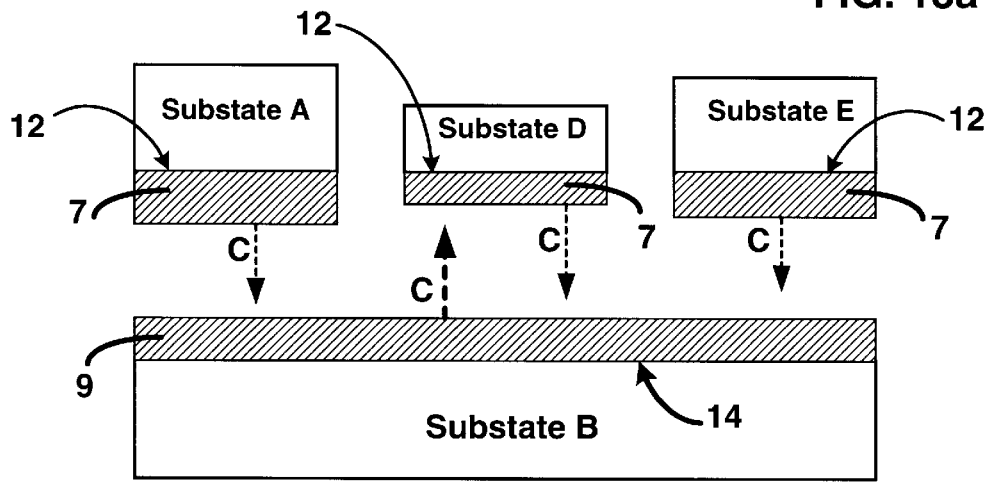
Figure 13C:
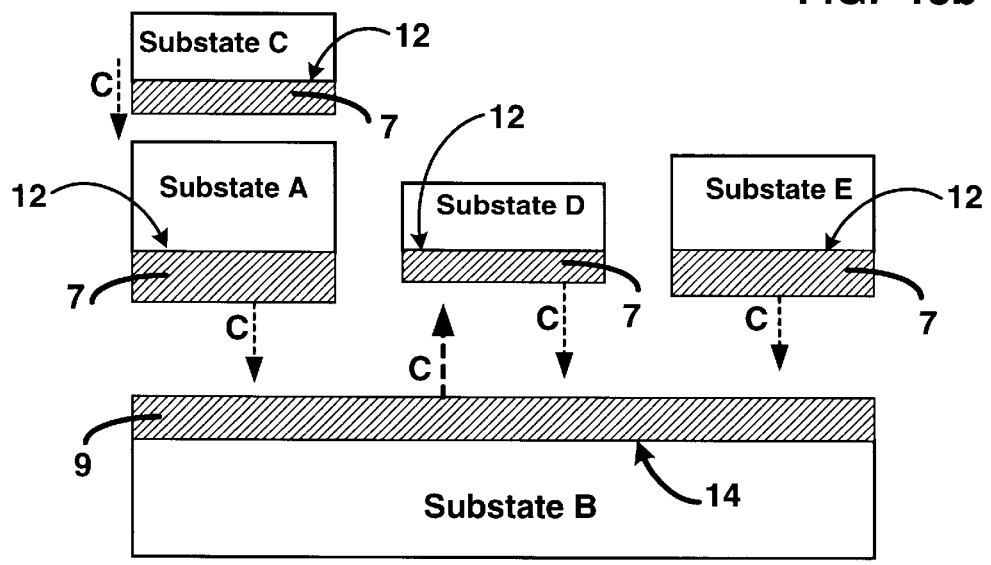

In another embodiment of the present invention, as illustrated in FIGS. 13a through 13c, instead of depositing alternating layers of amorphous compounds (11, 13) to form the first and second multi-stacked layers (15, 17) as was described above in connection with forming the amorphous compound bond layer 19, the amorphous compounds are deposited at the same time to form a single amorphous layer. In FIG. 13*a*, the active substrate A includes a first amorphous layer 7 formed on the bonding surface 12 and the base substrate B includes a second amorphous layer 9 formed on the mounting surface 14.

As set forth above, the first and second amorphous layers (7, 9) can be deposited within a range of temperatures including a range of temperatures from about 0.0 degrees centigrade to about 50.0 degrees centigrade. For instance, the first and second amorphous layers (7, 9) can be deposited at room temperature (approximately 25.0 degrees centigrade).

After forming the first and second amorphous layers (7, 9), the first and second amorphous layers (7, 9) are placed into contact with each other (see arrows C in FIGS. 13*a* through 13*c*). As stated above, substantially no pressure need be applied to the active substrate A and the base substrate B when the first and second amorphous layers (7, 9) are placed into contact with each other.

The active and base substrates (A, B) are then bonded to each other by annealing the active and base substrates (A, B) in an inert ambient to form an amorphous compound bond layer (see reference numeral 19 in FIG. 6) from a selenidation reaction between the first and second amorphous layers (7, 9). The selenidation reaction adhesively bonds the active and base substrates (A, B) to each other. Sputtering is the preferred technique for depositing the first and second amorphous layers (7, 9).

The first and second amorphous layers (7, 9) can be made from amorphous compounds that include but are not limited to those set forth above in Table 1 and Table 2. Therefore, amorphous compounds for the first and second amorphous layers (7, 9) can include selenium (Se) and another material such as indium (In), gallium (Ga), antimony (Sb), and aluminum (Al). For example, if amorphous selenium (Se) and amorphous indium (In) are used for the first and second amorphous layers (7, 9), then the annealing step results in an indium-selenium ($In_XSe_Y$) amorphous compound bond layer (see reference numeral 19 of FIG. 6).

Annealing of the active and base substrates (A, B) can be accomplished by heating the active and base substrates (A, B) at a temperature from about 200 degrees centigrade to about 300 degrees centigrade to form the amorphous compound bond layer 19.

In another embodiment of the present invention, the first and second amorphous layers (7, 9) can include selenium (Se) and tellurium (Te) (i.e. selenium-tellurium) and another material such as indium (In), gallium (Ga), antimony (Sb), and aluminum (Al). For instance, if amorphous selenium-tellurium (SeTe) and amorphous indium (In) are used for the first and second amorphous layers (7, 9), then the annealing step results in an indium-selenium-tellurium ($In_XSe_YTe_Z$, $In_2Se_{3-X}Te_X$, X<1) compound bond layer (see reference numeral 19 of FIG. 6).

When tellurium is (Te) added to the selenium (Se), annealing of the substrates (A, B) can be accomplished by heating the substrates (A, B) at a temperature from about 150 degrees centigrade to about 300 degrees centigrade to form the amorphous compound bond layer 19. As previously mentioned, the addition of tellurium (Te) to the selenium (Se) reduces the thermal budget for annealing from about 200 degrees centigrade to a lower temperature of about 150 degrees centigrade. In either of the above two embodiments, the inert ambient for the annealing process can be an ambient of nitrogen gas (Ni), for example.

The first and second amorphous layers (7, 9) can have a thickness that varies among the first and second amorphous layers (7, 9). That is, the first amorphous layer 7 and the second amorphous layer 9 can have identical thicknesses or they can have dissimilar thicknesses. Preferably, the first amorphous layer 7 and the second amorphous layer 9 have a thickness within a range of about 50 angstroms to about 8000 angstroms (i.e. from about 0.005 μm to about 0.80 μm).

The materials for the active and base substrates (A, B) can be identical to those set forth above and the active and base substrates (A, B) can be made from identical materials or they can be made from dissimilar materials.

FIG. 13*b* illustrates the use of the above first and second amorphous layers (7, 9) to bond a plurality of active substrates A, D, and E to a base substrate B. After annealing the active and base substrates, the first and second amorphous layers (7, 9) form an amorphous compound bond layer (see reference numeral 19 in FIG. 9*a*).

In FIG. 13*c*, the above first and second amorphous layers (7, 9) bond a plurality of active substrates A, D, and E to a base substrate B and bond an active substrate C to the active substrate A to form a three-dimensional stack (see reference numeral 22 in FIG. 9*b*) as was previously described above. After annealing the substrates, the first and second amorphous layers (7, 9) form an amorphous compound bond layer (see reference numeral 19 in FIG. 9*b*).

For the embodiments illustrated in FIGS. 13*a* through 13*c*, the active substrates and the base substrates can be non-destructively detached by dissolving the amorphous compound bond layer 19 using the selective etch material 27 as was described above in reference to FIGS. 10 through 12*c*.

In all of the embodiments described herein, including those having more than one active substrate or a three-dimensional stack, the active and base substrates (A, B) can have their thickness reduced by thinning either one or both of the active and base substrates (A, B). A thinning step can be performed prior to bonding the active and base substrates (A, B) to each other or the thinning step can be performed after the active and base substrates (A, B) have been bonded to each other. Thinning processes commonly used in the microelectronics art can be used to reduce the thickness of the active and base substrates (A, B). Those processes include but are not limited to grinding, lapping, polishing, and chemical mechanical planarization (CMP). Additionally, the thinning process may be used to planarize (i.e. render substantially flat) a surface of the active and base substrates (A, B).

Although several embodiments of the present invention have been disclosed and illustrated, the invention is not limited to the specific forms or arrangements of parts so described and illustrated. The invention is only limited by the claims.

What is claimed is:

1. A method of fabricating a bonded-substrate that includes at least one active substrate and a base substrate upon which the active substrate is bonded by a selenidation reaction, comprising:

forming a first multi-stacked layer by depositing alternating layers of a first material and a second material on a bonding surface of the active substrate, the first material including selenium, and the second material including a material selected from the group consisting of indium, gallium, antimony, and aluminum;

forming a second multi-stacked layer by depositing alternating layers of the first material and the second material on a mounting surface of the base substrate;

placing the first and second multi-stacked layers into contact with each other; and bonding the active and base substrates to each other by annealing the substrates in an inert ambient to form a compound bond layer that adhesively bonds the substrates to each other.

2. The method as set forth in claim 1 wherein the annealing step comprises heating the substrates at a temperature from about 200 degrees centigrade to about 300 degrees centigrade.

3. The method as set forth in claim 1 wherein the alternating layers of the first and second multi-staked layers are deposited at a temperature from about 0.0 degrees centigrade to about 50.0 degrees centigrade.

4. The method as set forth in claim 1 wherein the first material further includes tellurium.

5. The method as set forth in claim 4 wherein the annealing step comprises heating the substrates at a temperature from about 150 degrees centigrade to about 300 degrees centigrade.

6. The method as set forth in claim 4 wherein the alternating layers of the first and second multi-staked layers are deposited at a temperature from about 0.0 degrees centigrade to about 50.0 degrees centigrade.

7. The method as set forth in claim 1 wherein the active substrate and the base substrate are a material selected from the group consisting of a semiconductor, a metal, and a dielectric.

8. The method as set forth in claim 1 wherein the active substrate and the base substrate are a material selected from the group consisting of silicon, silicon oxide, alumina, and gallium arsenide.

9. The method as set forth in claim 1 wherein the active substrate and the base substrate are made from dissimilar materials.

10. The method as set forth in claim 1 wherein the active substrate and the base substrate are made from identical materials.

11. The method as set forth in claim 1 wherein the placing step comprises bringing the first and second multi-stacked layers into contact with each other with substantially no pressure being applied to the active and base substrates.

12. The method as set forth in claim 1 wherein the first material comprises an elemental compound and the second material comprises an elemental compound and the compound bond layer is a polycrystalline compound bond layer.

13. The method as set forth in claim 1 wherein the first material comprises an amorphous compound and the second material comprises an amorphous compound and the compound bond layer is an amorphous compound bond layer.

14. The method as set forth in claim 1 wherein the forming of the first and second multi-stacked layers further comprises:

forming the first multi-stacked layer on the bonding surface of at least one active substrate;

forming the second multi-stacked layer on a mounting surface of another active substrate;

placing the first and second multi-stacked layers into contact with each other; and forming a three-dimensional stack of active substrates by annealing the active substrates in an inert ambient to form a compound bond layer that adhesively bonds the active substrates to each other.

15. A method of fabricating a bonded-substrate that includes at least one active substrate and a base substrate upon which the active substrate is bonded by a selenidation reaction, comprising:

forming a first amorphous layer on a bonding surface of the active substrate;

forming a send amorphous layer on a mounting ace of the base substrate, the first and second amorphous layers including selenium and a material selected from the group consisting of indium, gallium, antimony, and aluminum;

placing the first and second amorphous layers into contact with each other; and bonding the active and base substrates to each other by annealing the substrates in an inert ambient to form an amorphous compound bond layer that adhesively bonds the substrates to each other.

16. The method as set forth in claim 15 wherein the annealing step comprises heating the substrates at a temperature from about 200 degrees centigrade to about 300 degrees centigrade.

17. The method as set forth in claim 15 wherein the first and second amorphous layers are deposited at a temperature from about 0.0 degrees centigrade to about 50.0 degrees centigrade.

18. The method as set forth in claim 15 wherein the selenium of the first and second amorphous layers further includes tellurium.

19. The method as set forth in claim 18 wherein the annealing step comprises heating the substrates at a temperature from about 150 degrees centigrade to about 300 degrees centigrade.

20. The method as set forth in claim 18 wherein the alternating layers of the first and second multi-staked layers are deposited at a temperature from about 0.0 degrees centigrade to about 50.0 degrees centigrade.

21. The method as set forth in claim 15 wherein the active substrate and the base substrate are a material selected from the group consisting of a semiconductor, a metal, and a dielectric.

22. The method as set forth in claim 15 wherein the active substrate and the base substrate are a material selected from the group consisting of silicon, silicon oxide, alumina, and gallium arsenide.

23. The method as set forth in claim 15 wherein the active substrate and the base substrate are made from dissimilar materials.

24. The method as set forth in claim 15 wherein the active substrate and the base substrate are made from identical materials.

25. The method as set forth in claim 15 wherein the placing step comprises bringing the first and second amorphous layers into contact with each other with substantially no pressure being applied to the active and base substrates.

* * * * *